United States Patent
Forcier

(10) Patent No.: US 9,275,981 B2
(45) Date of Patent: Mar. 1, 2016

(54) STRUCTURE AND METHOD FOR FORMING INTEGRAL NITRIDE LIGHT SENSORS ON SILICON SUBSTRATES

(71) Applicant: RoseStreet Labs, LLC, Phoenix, AZ (US)

(72) Inventor: Robert Forcier, Mesa, AZ (US)

(73) Assignee: RoseStreet Labs, LLC, Phoenix, AZ (US)

( * ) Notice: Subject to any disclaimer, the term of this patent is extended or adjusted under 35 U.S.C. 154(b) by 0 days.

(21) Appl. No.: 14/551,427

(22) Filed: Nov. 24, 2014

(65) Prior Publication Data

US 2015/0102450 A1   Apr. 16, 2015

Related U.S. Application Data

(62) Division of application No. 13/799,011, filed on Mar. 13, 2013, now Pat. No. 8,937,298.

(51) Int. Cl.
| | |
|---|---|
| *H01L 31/00* | (2006.01) |
| *H01L 25/16* | (2006.01) |
| *H01L 31/02* | (2006.01) |
| *H01L 31/0304* | (2006.01) |
| *H01L 31/18* | (2006.01) |

(52) U.S. Cl.
CPC ............ *H01L 25/167* (2013.01); *H01L 25/162* (2013.01); *H01L 31/02002* (2013.01); *H01L 31/02005* (2013.01); *H01L 31/02019* (2013.01); *H01L 31/03044* (2013.01); *H01L 31/18* (2013.01); *H01L 31/1848* (2013.01); *H01L 31/1852* (2013.01); *H01L 2224/11* (2013.01); *H01L 2924/0002* (2013.01)

(58) Field of Classification Search
CPC . H01L 31/18; H01L 25/167; H01L 31/03044; H01L 31/02002; H01L 25/162
USPC .................. 257/459, 21, 80, 82, 184–189
See application file for complete search history.

(56) References Cited

U.S. PATENT DOCUMENTS

| | | | |
|---|---|---|---|
| 2004/0029365 A1 | 2/2004 | Linthicum et al. | |
| 2004/0051099 A1 | 3/2004 | Moustakas | |
| 2009/0184254 A1 | 7/2009 | Miura | |
| 2009/0294777 A1 | 12/2009 | Cheng et al. | |
| 2010/0109113 A1 | 5/2010 | Jang | |
| 2011/0186975 A1 | 8/2011 | Chen | |
| 2013/0099249 A1* | 4/2013 | Forcier .............. | H01L 31/03044 257/76 |

FOREIGN PATENT DOCUMENTS

JP    2007165478 A    6/2007

OTHER PUBLICATIONS

WIPO Search Report and Written Opinion dated Mar. 4, 2013 for related Application No. PCT/US2012/061581; 11 sheets.

* cited by examiner

*Primary Examiner* — Thien F Tran
(74) *Attorney, Agent, or Firm* — Greenberg Traurig, LLP

(57) ABSTRACT

A semiconductor integrated circuit has one or more integral nitride-type sensors. In one embodiment, an integral nitride-type sensor and a coplanar supplemental circuit are formed from a common silicon substrate base. In another embodiment, an integral nitride-type sensor and a supplemental circuit are integrated in a vertical orientation.

3 Claims, 7 Drawing Sheets

STRUCTURE AND METHOD FOR FORMING INTEGRAL NITRIDE LIGHT SENSORS ON SILICON SUBSTRATES

CROSS-REFERENCE TO RELATED APPLICATIONS

This is a divisional application of U.S. Non-Provisional application Ser. No. 13/799,011, filed Mar. 13, 2013, entitled "STRUCTURE AND METHOD FOR FORMING INTEGRAL NITRIDE LIGHT SENSORS ON SILICON SUBSTRATES," by R. Forcier, the entire contents of which application is incorporated by reference as if fully set forth herein.

The present application is related to U.S. Non-Provisional patent application Ser. No. 13/659,206, filed on Oct. 24, 2012, entitled "Nitride UV Light Sensors On Silicon Substrates," by Forcier et al., which itself claims priority to U.S. Provisional Patent Application Ser. No. 61/550,868, filed on Oct. 24, 2011, entitled "Nitride UV Light Sensors On Silicon Substrates," by Forcier et al., the entire contents of which applications are hereby incorporated by reference as if fully set forth herein.

FIELD OF THE TECHNOLOGY

The various embodiments disclosed herein generally relate to a structure and method for forming semiconductor devices, and more particularly to a structure and method for forming semiconductor integrated circuits that include one or more sensors formed as an integral part thereof.

BACKGROUND

Electronic assemblies and products that include sensors typically utilize discrete sensors (i.e., sensors that are not an integral part of any other system components or other semiconductor devices). Discrete sensors can be very expensive as they are typically fabricated on expensive substrate materials. For example, discrete UV sensors are expensive because they typically utilize costly substrate materials such as silicon carbide or sapphire.

Cost considerations notwithstanding, discrete electronic components can further present a component-size consideration in an industry best defined by shrinking product sizes and slick designs that translate into a need for smaller and more efficient components.

SUMMARY OF THE DESCRIPTION

Various embodiments disclosed herein relate to a semiconductor integrated circuit having one or more integral nitride-type sensors. Some embodiments are summarized in this section.

In some embodiments, the integral nitride-type sensor is based on a silicon substrate, and is integrated by substrate-to-substrate bonding. In one embodiment, the integrated nitride-type sensor is composed of gallium nitride (GaN). In another embodiment, the integrated nitride-type sensor is composed of gallium aluminum nitride (GaAlN). In yet another embodiment, the integrated nitride-type sensor is composed of gallium indium nitride (InGaN).

One or more embodiments include an integral nitride-type sensor and a coplanar supplemental circuit that are formed from a common silicon substrate base. Other embodiments include an integral nitride-type sensor and a supplemental circuit integrated in a vertical orientation.

In one embodiment, the vertical integration is achieved through substrate bonding. In some embodiments, an integral nitride-type sensor and a supplemental circuit are interconnected through a three-dimensional package. In one embodiment, the integral nitride-type sensor is at least one of a UVA, a UVB, and a UVC-type sensor. In one embodiment, the supplemental circuit is a CMOS circuit.

In various other embodiments, a method is provided for forming semiconductor integrated circuits that include nitride-type sensors formed as an integral part thereof. In one embodiment, a method is provided for forming an integral nitride-type sensor and a coplanar supplemental circuit from a common silicon substrate base. In another embodiment, a method is provided for integrating an integral nitride-type sensor and a supplemental circuit in a three-dimensional package. In one embodiment, the integral nitride-type sensor is at least one of a UVA, a UVB, and a UVC-type sensor. In one embodiment, the supplemental circuit is a CMOS circuit.

Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
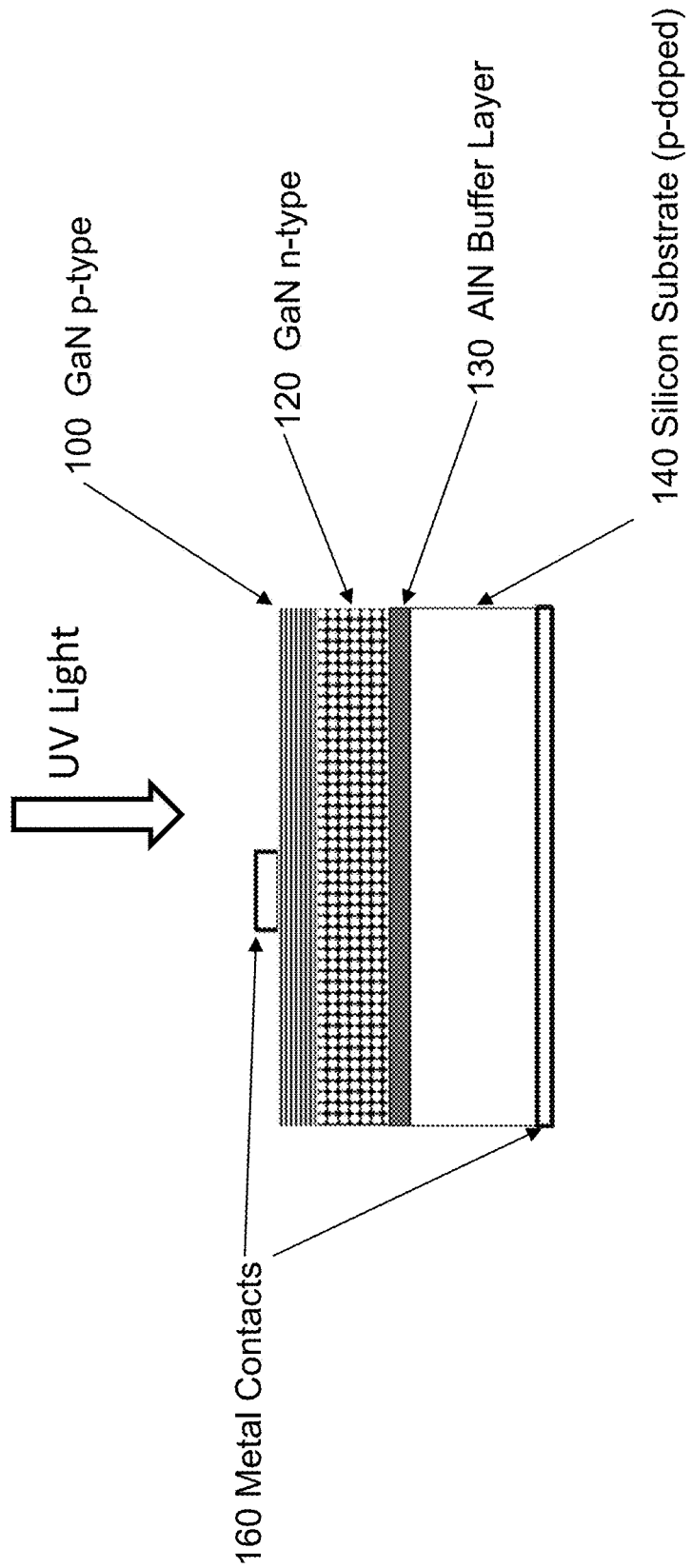
FIG. 1 shows the layers of an exemplary nitride UV sensor, according to one embodiment.

Nitride sensors, such as gallium nitride (GaN), gallium aluminum nitride (GaAlN), or gallium indium nitride (InGaN) sensors, have excellent reliability and sensitivity, but are typically difficult to manufacture on silicon substrates. FIG. 1 illustrates the layers of an exemplary nitride-type UV sensor. The exemplary sensor illustrated in FIG. 1 includes a p-type GaN top layer (100), followed by the n-type GaN (120) layer, which is in turn placed on a buffer layer of AlN (130), and formed on a silicon substrate (140) with metal contacts (160).

Figure 2:
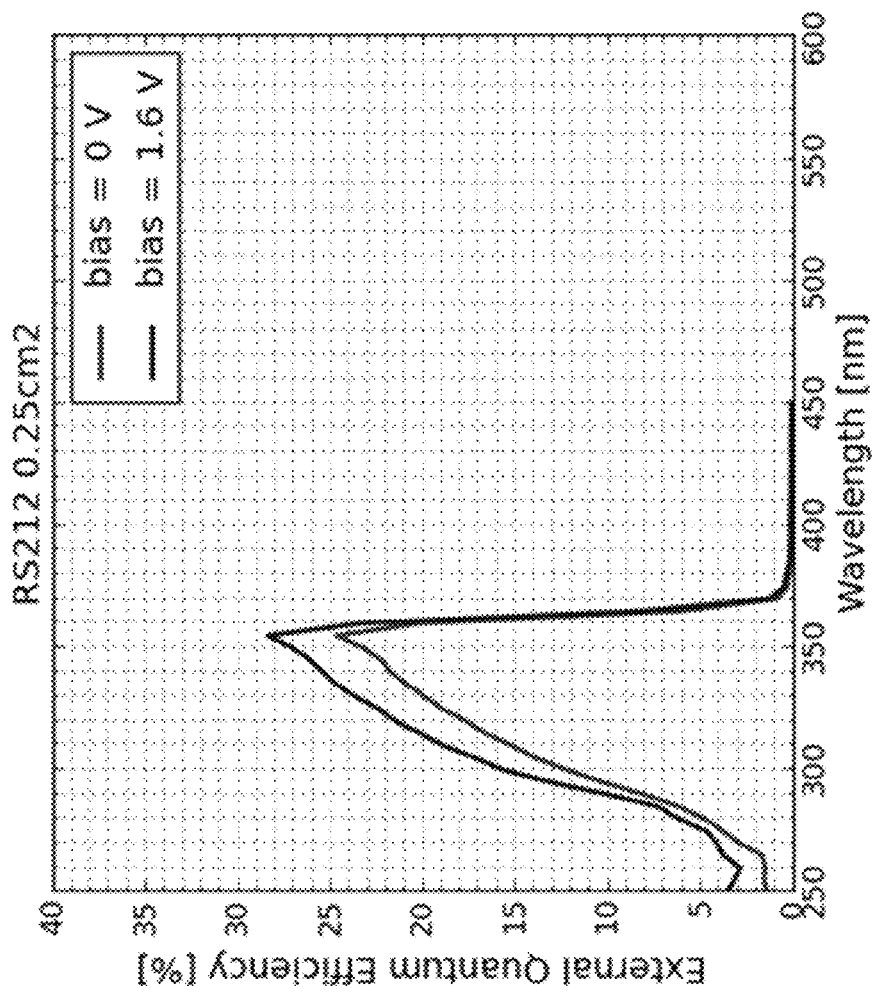
FIG. 2 shows a spectral response curve for the sensor of FIG. 1.

FIG. 2 is a spectral response curve for the device in FIG. 1, illustrating the external quantum efficiency (EQE) and the corresponding wavelength. The figure illustrates a UVA response below 370 nm.

Figure 3:
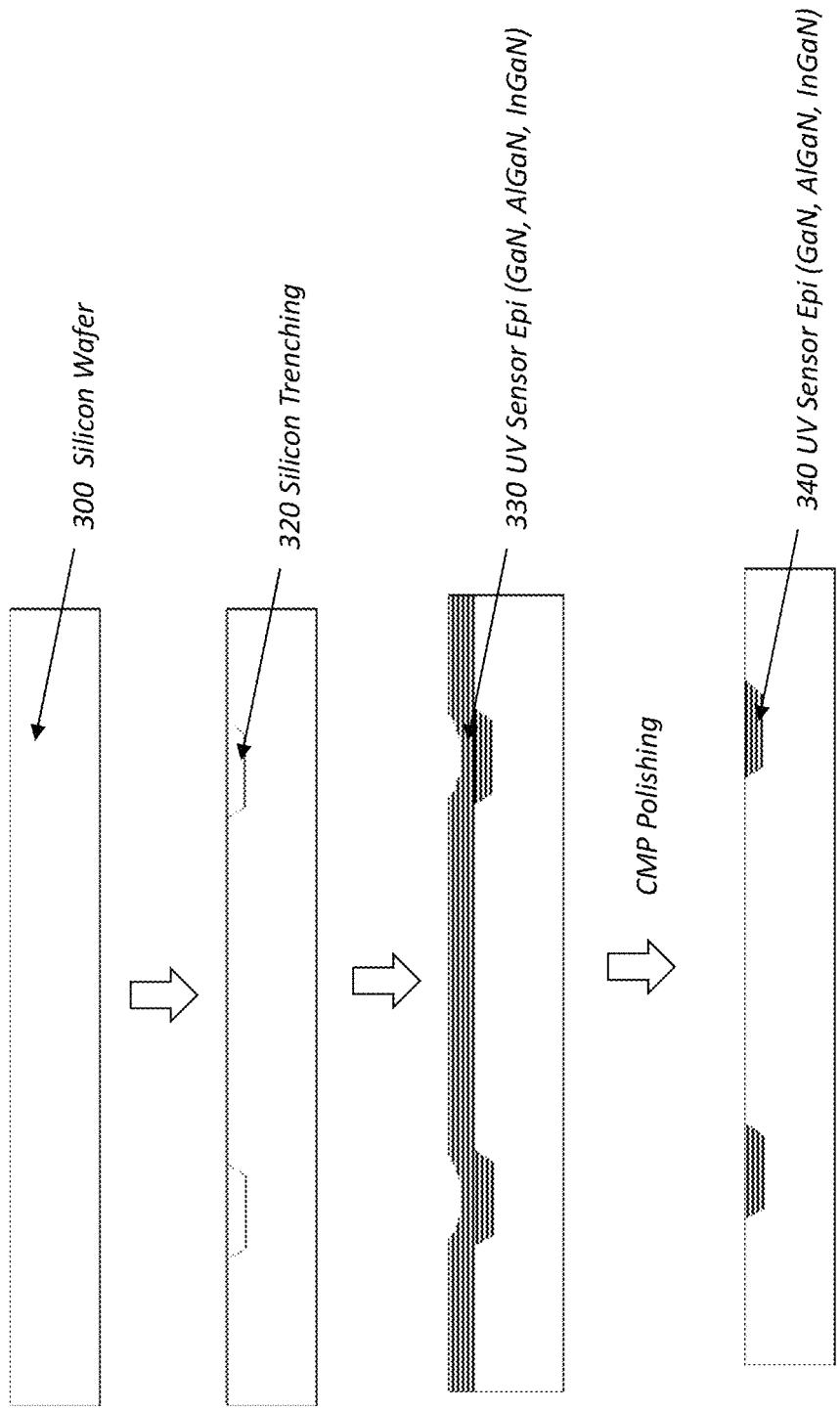
FIG. 3 shows a process for forming an integral nitride UV sensor on a silicon substrate, according to one embodiment.

FIG. 3 illustrates an embodiment of a method to produce a UV-type nitride sensor formed on a silicon substrate. The silicon substrate (300) (e.g., a silicon wafer) is processed through an initial trenching process (320), followed by an epitaxial deposition of the nitride P/N junction on the silicon wafer (330) to form the final UV sensor (340) after chemical mechanical polishing (CMP) planarization. The final UV sensor (340) has been formed at a top surface of silicon wafer (300).

Figure 4:
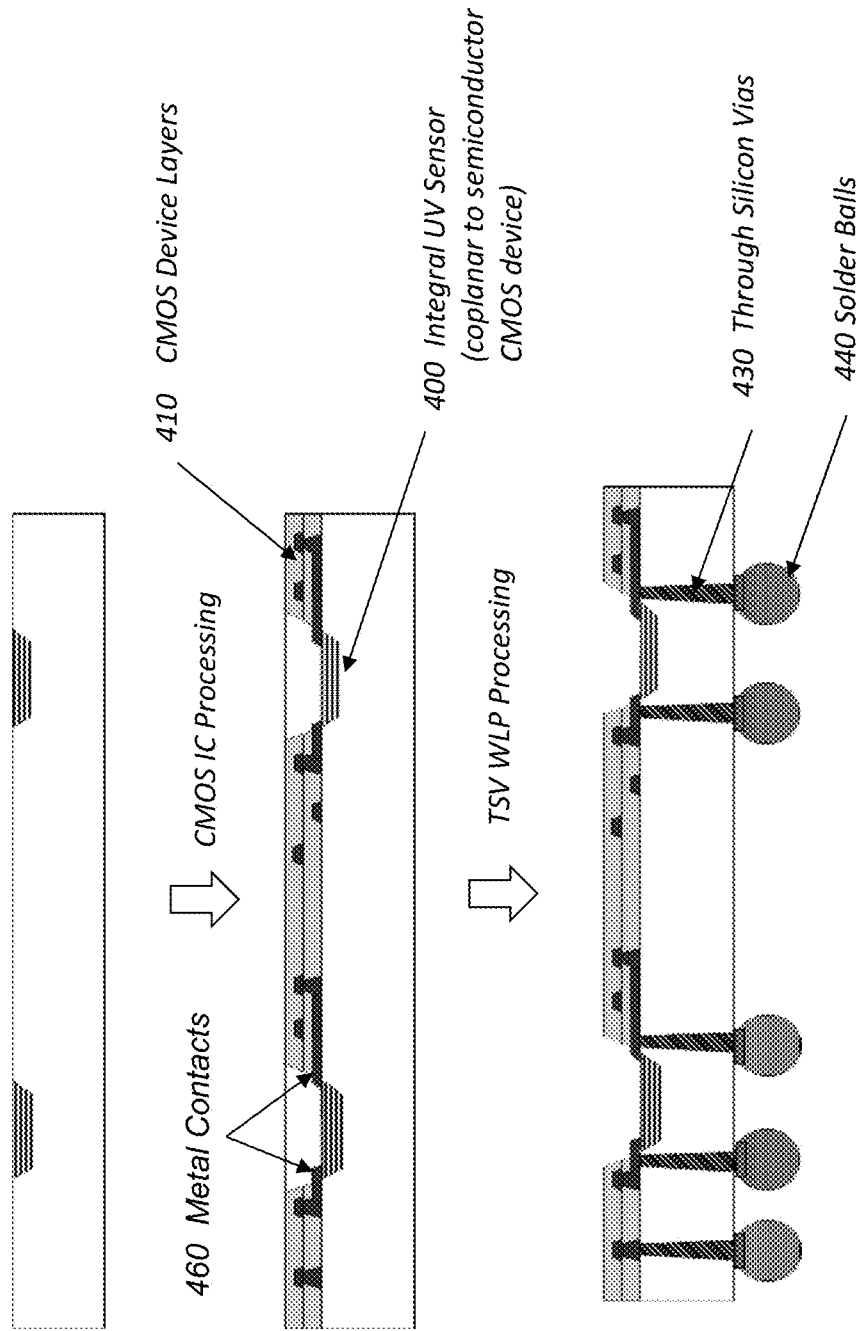
FIG. 4 shows an integral nitride UV sensor coplanar with a typical semiconductor integrated circuit such as a CMOS circuit, according to one embodiment.

FIG. 4 illustrates an embodiment of an integral UV nitride sensor (400), which is coplanar with a typical semiconductor integrated circuit such as, for example, a CMOS device structure (410). In the illustrated embodiment, the semiconductor package of UV nitride sensor (400) and the coplanar CMOS are interconnected through silicon vias (430) and solder balls (440) with the metal contacts of the nitride sensor (460). Solder balls (440) are disposed on an under bump metal (UBM) or pad at a bottom surface of silicon substrate (300).

Figure 5:
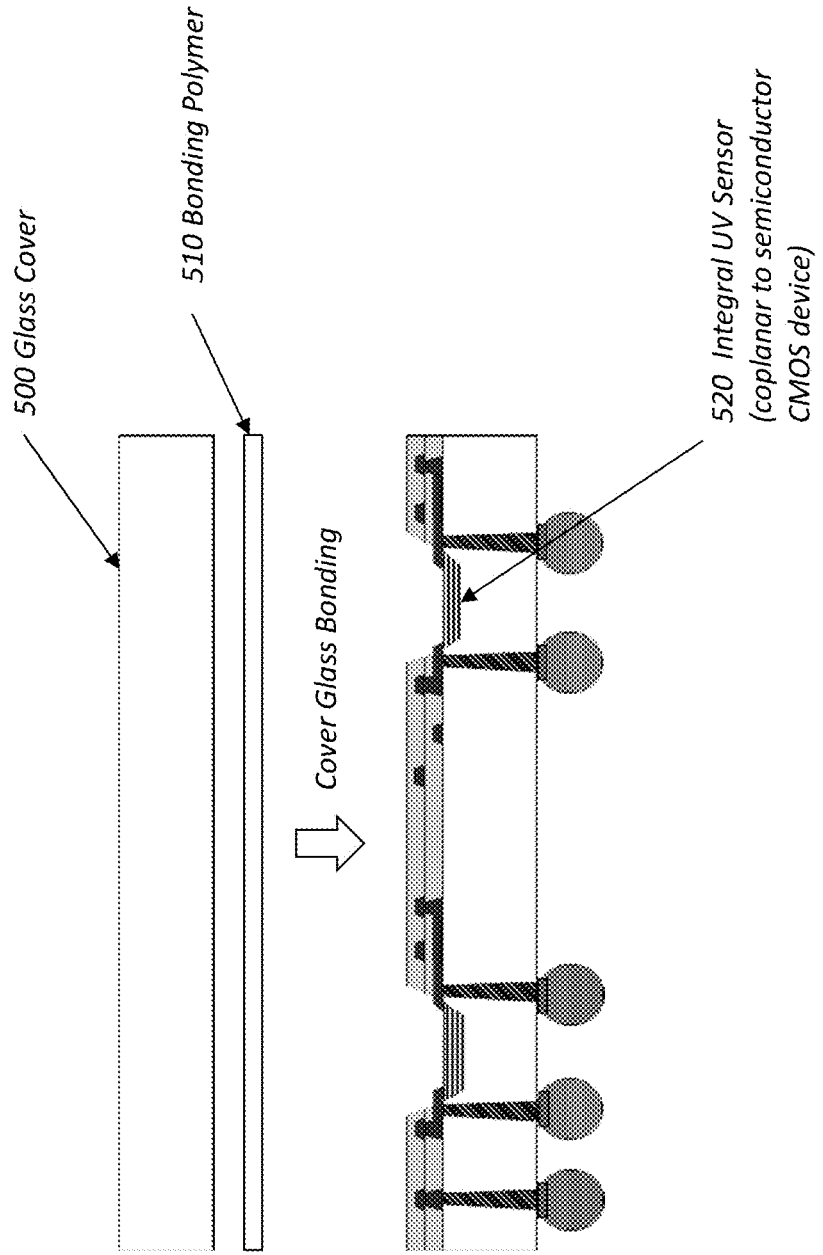
FIG. 5 shows an integral nitride UV sensor having a transparent cover (510) bonded over a UV sensor (520) and collectively integral to a typical semiconductor integrated circuit such as a CMOS circuit, according to one embodiment.

FIG. 5 illustrates an embodiment having a transparent (e.g., glass) cover (500) bonded with a polymer adhesive (510) over a nitride UV sensor (520) integral to a CMOS device.

Figure 6:
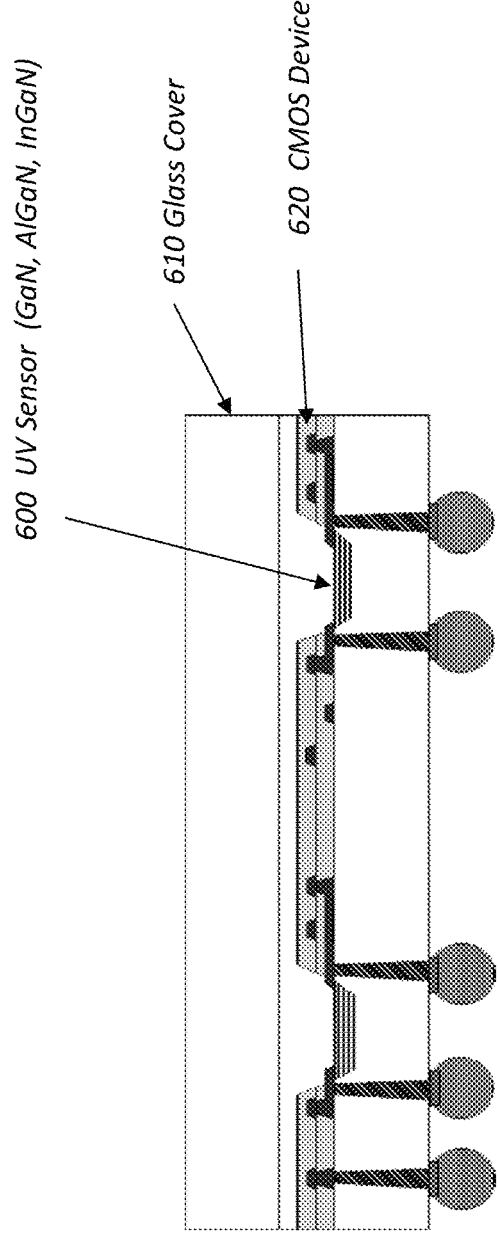
FIG. 6 shows a nitride UV sensor (600) integral and planar to a CMOS device (620) encapsulated with a transparent cover (610), according to one embodiment.

FIG. 6 illustrates an embodiment including a nitride UV sensor (600) integral and coplanar to a CMOS device (620) encapsulated with a transparent (e.g., glass) cover (610).

Figure 7:
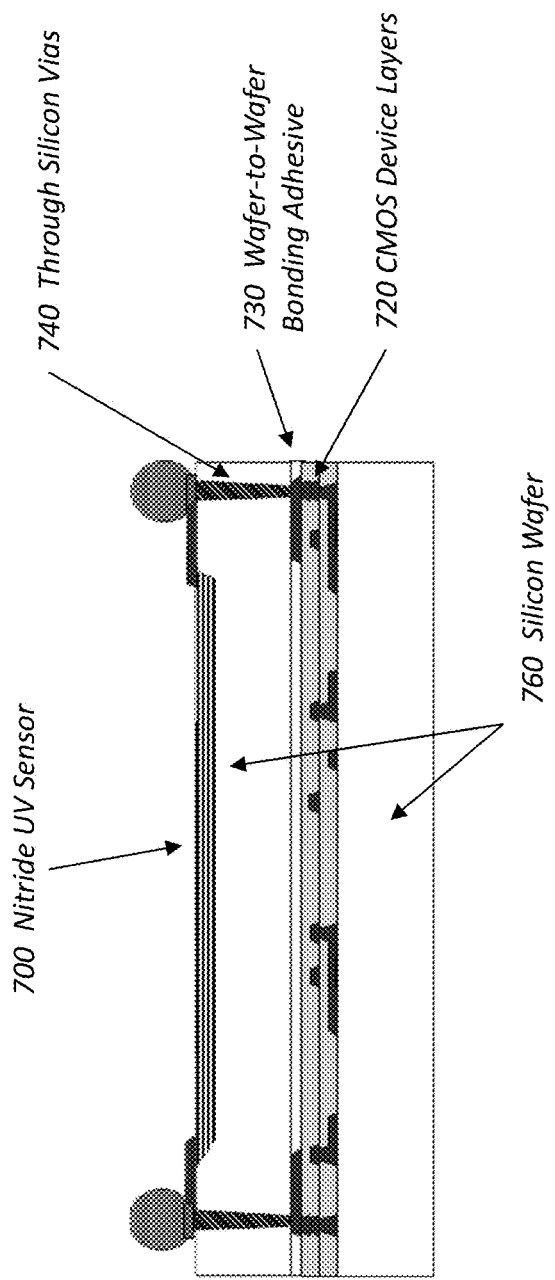
FIG. 7 shows a nitride UV sensor (700) bonded in a three-dimensional (3D) semiconductor package, according to one embodiment.

FIG. 7 illustrates an embodiment including a nitride UV sensor (700) bonded in a three-dimensional (3D) semiconductor package and vertically positioned relative to a CMOS device (720) utilizing a wafer-to-wafer bonding adhesive (730), through silicon vias (740) utilizing two base silicon wafers (760).

Some embodiments disclosed herein facilitate the formation of nitride UV sensors integral in either planar or vertical orientation to silicon semiconductor devices. One or more embodiments provide a structure for manufacturing a highly sensitive UV sensor precisely positioned coplanar with a CMOS integrated circuit by simultaneously manufacturing both on the same silicon wafer. Other embodiments provide a structure for positioning a UV sensor vertically to an integrated circuit device through a 3D-packaging approach of substrate-to-substrate bonding, followed by interconnecting the sensor with the devices through silicon vias.

Various further embodiments are described below. In a first embodiment, an apparatus includes: a semiconductor substrate comprising semiconductor devices at a top surface of the substrate, and further comprising vias extending from the top surface to a bottom surface of the substrate; a nitride sensor formed at the top surface of the substrate; and a plurality of UBMs or pads, each UBM or pad connected by one of the vias to the sensor.

In one embodiment, the apparatus further comprises a transparent cover overlying the sensor and overlying the semiconductor devices. In one embodiment, the transparent cover is a glass cover. In one embodiment, the apparatus further comprises a bonding polymer bonding the cover to the semiconductor substrate.

In one embodiment, the apparatus further comprises a solder ball on each of the plurality of UBMs or pads. In one embodiment, the sensor is coplanar to the semiconductor devices.

In one embodiment, the sensor comprises GaN, AlGaN, or InGaN. In one embodiment, the semiconductor substrate is a silicon wafer.

In one embodiment, the apparatus further comprises metal contacts for the sensor, each metal contact connected to one of the vias.

In yet another embodiment, an apparatus includes: a first semiconductor substrate comprising a nitride sensor formed on a surface thereof (e.g., the top surface) and comprising a plurality of through vias; and a second semiconductor substrate comprising semiconductor devices formed on a surface thereof (e.g., the top surface), wherein each of the vias connects a metal layer or contact of one of the semiconductor devices to a metal contact of the sensor.

In one embodiment, the sensor is in a vertical orientation relative to the semiconductor devices. In one embodiment, the apparatus further comprises a wafer-to-wafer bonding adhesive between the first substrate and the second substrate.

In another embodiment, a method includes: forming a sensor on a top surface of a semiconductor substrate; forming semiconductor devices at the top surface of the semiconductor substrate; forming a via fully through the semiconductor substrate, the via for connecting a UBM or pad to the sensor; and forming the UBM or pad on a bottom surface of the semiconductor substrate. In one embodiment, the method further comprises forming a solder ball on the UBM or pad.

In one embodiment, the method further comprises bonding a transparent cover to the top surface of the semiconductor substrate. In one embodiment, the bonding comprises using a bonding polymer between the semiconductor substrate and the cover.

In one embodiment, the forming the sensor comprises forming a P/N junction on the semiconductor substrate using an epitaxial deposition. In one embodiment, the method further comprises, after forming the sensor, performing chemical mechanical polishing at the top surface of the semiconductor substrate.

The use of UV light sensors has been discussed above in various embodiments. It should be noted, however, that in alternative embodiments visible light sensors may be formed.

Also, in various embodiments, the light sensors (UV and/or visible light) discussed above may be implemented in many types of structures and products, including, but not limited to, mobile devices, smart phones, tablets, displays, and automotive and medical products. For example, the light sensor may detect ambient light for a mobile device, and make adjustments in the operation of a function of the mobile device based on a sensed ambient light level (e.g., dimming a display, or sending a notification to another computing device).

Various embodiments discussed herein only require the growing of very small size devices, which minimizes thin film layer cracking originating from the lattice mismatch between the nitride layer and Si substrate. Also, it should be noted that for typical embodiments, nitride semiconductors as discussed herein are grown on the (111) surface of Si.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus, comprising:
   a first semiconductor substrate comprising a nitride sensor formed on a surface thereof and comprising a plurality of through vias; and
   a second semiconductor substrate comprising semiconductor devices formed on a surface thereof, wherein each of the through vias connects a metal layer or contact of one of the semiconductor devices to a metal contact of the nitride sensor.

2. The apparatus of claim 1, wherein the sensor is in a vertical orientation relative to the semiconductor devices.

3. The apparatus of claim 1, further comprising a wafer-to-wafer bonding adhesive between the first semiconductor substrate and the second semiconductor substrate.

* * * * *